United States Patent [19]
Banerjee et al.

[11] Patent Number: 5,493,505
[45] Date of Patent: Feb. 20, 1996

[54] INITIALIZABLE ASYNCHRONOUS CIRCUIT DESIGN

[75] Inventors: Savita Banerjee, Bethlehem, Pa.; Srimat T. Chakradhar, No. Brunswick; Rabindra K. Roy, Plainsboro, both of N.J.

[73] Assignee: NEC USA, Inc., Princeton, N.J.

[21] Appl. No.: 144,802

[22] Filed: Oct. 28, 1993

[51] Int. Cl.$^6$ .................................................. H03K 17/22
[52] U.S. Cl. ........................ 364/488; 364/489; 364/491; 364/578
[58] Field of Search .................................. 364/488, 489, 364/490, 491, 578, 900, 580, 200

[56] References Cited

U.S. PATENT DOCUMENTS

| | | | |
|---|---|---|---|
| 4,167,789 | 9/1979 | Faustini | 364/900 |
| 4,845,633 | 7/1989 | Furtek | 364/490 |
| 4,862,399 | 8/1989 | Freeman | 364/580 |
| 4,922,413 | 5/1990 | Stoughton et al. | 364/200 |
| 5,005,136 | 4/1991 | Van Berkel et al. | 364/490 |
| 5,036,473 | 7/1991 | Butts et al. | 364/489 |
| 5,163,016 | 11/1992 | Har'El et al. | 364/578 |
| 5,331,569 | 7/1994 | Iijima | 364/489 |
| 5,337,255 | 8/1994 | Seidel et al. | 364/489 |

OTHER PUBLICATIONS

Carl Pixley et al, "Exact Calculation of Synchronization Sequences Based on Binary Decision Diagrams", Proc. of the 29th ACM/IEEE Design Automation Conf., pp. 620–623, 1992.

S. T. Chakradhar et al, "Synthesis of Initializable Asynchronous Circuits", 7th Int'l Conference on VLSI Design, Jan. 1994.

Kwang–Ting Cheng et al, "State Assignment for Initializable Synthesis", IEEE 1989, pp. 212–215.

L. Lavagno et al, "Algorithms for synthesis of hazard-free asynchronous circuits", 28th ACM/IEEE Design Automation Conf. pp. 302–308.

Carl Pixley et al, "Calculating Resetability and Reset Sequences", IEEE 1991, pp. 376–378.

Ben Mathew et al, "Partial Reset: An Inexpensive Design for Testability Approach", IEEE 1993, pp. 151–155.

*Primary Examiner*—Kevin J. Teska
*Assistant Examiner*—Russell W. Frejd
*Attorney, Agent, or Firm*—Philip J. Feig

[57] ABSTRACT

A method of asynchronous circuit synthesis of initializable circuits from signal transition graphs (STG) that are either functionally initializable or functionally uninitializable is described. For functionally initializable cases, an initializable implementation can be achieved by proper assignment of don't care values. If the STG is not functionally initializable, the sources of uninitializability in the STG are identified and the STG is transformed into a functionally initializable specification by exploiting concurrency. Initializability is achieved at the expense of minimal removal of concurrency. Moreover, the transformation does not violate liveness and unique state coding properties of the STG. When the STG is functionally initializable or after an uninitializable STG is transformed to become functionally initializable the result is an initializable circuit design.

20 Claims, 11 Drawing Sheets

| Or⁺ IrOa |     |     |     |     |
|----------|-----|-----|-----|-----|
| IaOr     | 00  | 01  | 11  | 10  |
| 00       | 0   | 0   | 0   | 0   |
| 01       | 1   | 0   | 0   | 1   |
| 11       | 1   | 1   | 1   | 1   |
| 10       | 1   | 0   | 0   | 1   |

| Ia IrOa |     |     |     |     |
|---------|-----|-----|-----|-----|
| IaOr    | 00  | 01  | 11  | 10  |
| 00      | 0   | 0   | 1   | 1   |
| 01      | 0   | 0   | 0   | 0   |
| 11      | 0   | 0   | 1   | 1   |
| 10      | 1   | 1   | 1   | 1   |

|    | x za |    |    |    |
|----|----|----|----|----|
| xy | 00 | 01 | 11 | 10 |
| 00 | 0  | 0  | 0  | 1  |
| 01 | 0  | 0  | φ1 | φ2 |
| 11 | 0  | 0  | φ3 | φ4 |
| 10 | 1  | φ5 | φ6 | 1  |
|    | y xz |    |    |    |
|----|----|----|----|----|
| ya | 00 | 01 | 11 | 10 |
| 00 | 0  | 0  | 0  | 1  |
| 01 | 0  | 0  | 0  | 1  |
| 11 | 0  | 0  | 0  | 1  |
| 10 | 1  | 1  | 1  | 1  |
|    | z xb |    |    |    |
|----|----|----|----|----|
| yz | 00 | 01 | 11 | 10 |
| 00 | 1  | 0  | 0  | 0  |
| 01 | 1  | 1  | 0  | 1  |
| 11 | 1  | 1  | 0  | 1  |
| 10 | 0  | 0  | 0  | 0  |
Figure 5
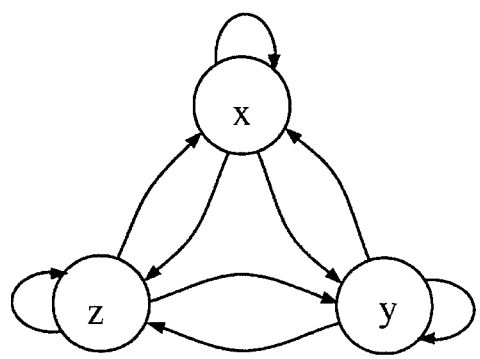
Figure 6
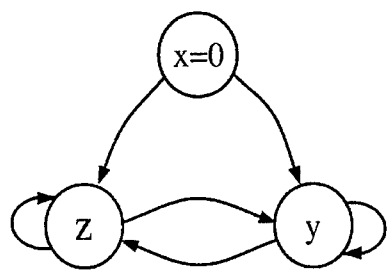 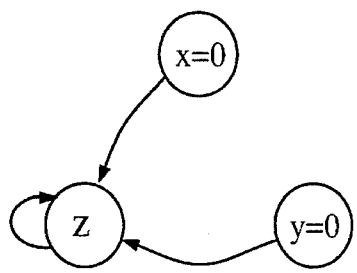 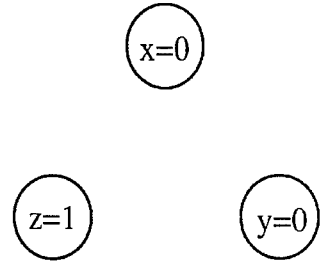
Figure 7(a)  Figure 7(b)  Figure 7(c)

| Dr\LaZr | 00 | 01 | 11 | 10 |
|---|---|---|---|---|
| Dr x | | | | |
| 00 | 0 | φ1 | φ2 | 1 |
| 01 | 0 | φ3 | φ4 | φ5 |
| 11 | 0 | 1 | 1 | 1 |
| 10 | 1 | 1 | 1 | 1 |

| Zr\xZr | 00 | 01 | 11 | 10 |
|---|---|---|---|---|
| LrDa | | | | |
| 00 | 0 | φ1 | φ2 | 0 |
| 01 | 1 | 1 | 0 | 0 |
| 11 | 0 | φ3 | φ4 | φ5 |
| 10 | 0 | φ6 | φ7 | φ8 |

| Lr\xZa | 00 | 01 | 11 | 10 |
|---|---|---|---|---|
| DrLr | | | | |
| 00 | 1 | 0 | 0 | 0 |
| 01 | 1 | φ1 | φ2 | φ3 |
| 11 | 0 | φ4 | φ5 | φ6 |
| 10 | 0 | 0 | 0 | 0 |

| x\Za | 0 | 1 |
|---|---|---|
| Da x | | |
| 00 | 0 | 0 |
| 01 | 0 | 0 |
| 11 | 1 | 1 |
| 10 | 0 | 1 |

Figure 8

| b\bcx ad | 000 | 001 | 011 | 010 | 110 | 111 | 101 | 100 |
|---|---|---|---|---|---|---|---|---|
| 00 | 0 | φ1 | φ2 | φ3 | 1 | φ4 | 1 | 0 |
| 01 | φ5 | φ6 | 0 | φ7 | 1 | 0 | 1 | φ8 |
| 11 | φ9 | 1 | 0 | 1 | 1 | φ10 | 1 | φ11 |
| 10 | 0 | 1 | φ12 | 1 | 1 | φ13 | 1 | φ14 |

| c\bcx ad | 000 | 001 | 011 | 010 | 110 | 111 | 101 | 100 |
|---|---|---|---|---|---|---|---|---|
| 00 | 0 | φ1 | φ2 | φ3 | 1 | φ4 | 0 | 0 |
| 01 | φ5 | φ6 | 1 | φ7 | 1 | 1 | 0 | φ8 |
| 11 | φ9 | 0 | 0 | 1 | 1 | φ10 | 0 | φ11 |
| 10 | 1 | 0 | φ12 | 1 | 1 | φ13 | 0 | φ14 |

| x\bcx ad | 000 | 001 | 011 | 010 | 110 | 111 | 101 | 100 |
|---|---|---|---|---|---|---|---|---|
| 00 | 0 | φ1 | φ2 | φ3 | 0 | φ4 | 0 | 0 |
| 01 | φ5 | φ6 | 1 | φ7 | 1 | 1 | 1 | φ8 |
| 11 | φ9 | 1 | 1 | 0 | 0 | φ10 | 1 | φ11 |
| 10 | 0 | 1 | φ12 | 0 | 0 | φ13 | 1 | φ14 |

Figure 11

INITIALIZABLE ASYNCHRONOUS CIRCUIT DESIGN

BACKGROUND OF INVENTION

The present invention relates to a method of asynchronous circuit synthesis which results in the design of an initializable circuit whether or not the initial design specification is functionally initializable. When the initial design specification is not functionally initializable, the specification is modified to result in a functionally initializable design without changing the operating characteristics of the design.

Initializability is a key requirement for ensuring the testability of sequential circuits. However, state-of-the-art automatic tools for synthesizing asynchronous circuits may result in circuits that are not initializable by gate level analysis tools.

The rapidly increasing complexity of today's systems and the critical demand for high performance has led designers to reconsider asynchronous design methodology. A synchronous circuit may be viewed as a restricted version of an asynchronous circuit where all operations are performed in synchrony with a global clock. The discreteness of time by the global clock facilitates analysis, synthesis, and testing. However, a global clock presents other problems such as clock skew, high power consumption, and worst case execution time that confine high performance applications to small chip areas. Asynchronous designs typically provide a better performance than comparable synchronous designs in situations where global synchronization with a high-speed clock limits system throughput. Elimination of global synchronization is perhaps the greatest motivating force behind the asynchronous approach. For computations that are data dependent, asynchronous specifications are more natural. Operations are performed upon the availability of operands and there is no need to wait for the arrival of a global synchronization signal. However, until recently these advantages had been overlooked due to the inherent complexities associated with the feasible implementation and testing of asynchronous designs.

Significant advances have been made in automating the synthesis of asynchronous circuits. These techniques have been embodied in several computer-aided design tools such as are described in a PhD thesis entitled "Synthesis of Self-Timed VLSI Circuits from Graph-Theoretic Specifications" by T. A. Chu at MIT in 1987 and in a PhD thesis entitled "Synthesis and Testing of Bounded Wire Delay Asynchronous Circuits from Signal Transition Graphs," by L. Lavagno at UC Berkeley in 1992. However, significant difficulty has been experienced in testing the circuits that were synthesized by these automatic programs. Some of the circuits could not be initialized by the test generator and therefore, no test sequence was generated. Initialization is the process of driving the state signals in the circuit to a known state irrespective of the power-up state of the circuit. This is an important first phase in the test generation of sequential circuits. In the absence of designer-supplied initialization vectors for automatically synthesized circuits, the test generator has to derive the initialization sequence. All state signals in the circuit are initially assumed to be in an unknown state and the test generator derives a sequence of input vectors that will bring all state signals to a known state. If the synthesized implementation cannot be initialized, then the test generator or other gate level analysis tools are completely ineffective.

The difficulty in testing the synthesized implementations can be understood by looking at the current focus of asynchronous circuit synthesis tools. Since the synthesis problem is so difficult, previous work on automatic synthesis was primarily aimed at solving the basic issues. It focused on realizing minimum logic and hazard-free implementations. These two objectives do not guarantee that the implementation is initializable. In fact, minimal area implementations may have to be sacrificed for initializable implementations.

Initializability of synchronous sequential circuits has been described in an article by C. Pixley and G. Beihle entitled "Calculating Resetability and Reset Sequences", Proc. of the Int. Conf. on Computer Aided Design, pp. 376–379, 1992 and in an article by C. Pixley, S. W. Jeong and G. D. Hatchel entitled "Exact Calculation of Synchronization Sequences Based on Binary Decision Diagrams", Proc. of the 29th ACM/ICEE Design Automation Conf., pp. 620 to 623, 1992. These methods determine whether or not a given circuit is initializable and determine the initialization sequences for the initializable circuits. The initialization problem is also manifest in the automatic synthesis of synchronous circuits where the improper state assignment results in implementations that are not initializable. Mathew and Saab in an article entitled "Partial Reset: An Inexpensive Design for Testability Approach" in Proc. EDAC/EURO-ASIC, pp 151 to 155, April 1993, identified the importance of initializability and provided a low-cost solution by providing a technique to perform partial reset in the hardware.

Explicit reset mechanism is a post-synthesis modification that requires an extra primary input and some additional logic for each state signal. Also, the wiring from the reset input pin to the state signals is an additional overhead. A more attractive solution is to consider circuit testability during the synthesis procedure itself and realize initializable implementations without explicit reset.

A design is functionally initializable if there exists at least one corresponding gate-level implementation that is initializable. Circuit initializability is intimately related to the don't care assignments made during synthesis. However, this procedure fails when the specification of the asynchronous circuit is functionally uninitializable.

SUMMARY OF THE INVENTION

The present invention concerns a novel method of synthesizing circuits for functionally initializable designs and of realizing initializable gate-level implementations for designs that are not functionally initializable. A Signal Transition Graph (STG) is used to specify the circuit behavior. A STG can represent concurrency, which gives the designer an extra degree of flexibility to transform the given STG into another STG that exhibits the same functional behavior. A method is described to systematically remove concurrency in order to achieve initializability. The removal of concurrency does not always lead to degradation in performance. To this end, the initializability goal is achieved by the removal of minimal concurrency. After the specification is functionally initializable, the final initializable circuit can be generated.

The present invention provides a method for the synthesis of asynchronous circuits which are initializable starting from a signal transition graph which is not functionally initializable. The necessary conditions for a design specification to be initializable are identified. The invention identifies sources of uninitializability in the STG and transforms the STG into a functionally initializable specification at the expense of minimal removal of concurrency. The resultant transformation does not violate liveness and unique state coding properties of the STG. The resulting transformed STG is used as the basis of the design of an asynchronous circuit which is initializable for subsequent testing.

A principal object of the present invention is therefore, the provision of a method of synthesizing an asynchronous circuit to assure that the circuit is initializable.

A further object of the invention is the provision of a method for obtaining initialization sequences for initializing the circuit.

Another object of the invention is the provision of a method of transforming a functionally uninitializable signal transition graph into a functionally initializable signal transition graph for use in asynchronous circuit design.

Further and still other objects of the present invention will become more clearly apparent when the following description is read in conjunction with the accompanying drawings.

BRIEF DESCRIPTION OF THE DRAWINGS

FIG. 5 are Karnaugh maps of a handshake controller;

FIG. 6 is a dependency graph for a minimal-logic implementation of the handshake controller;

FIGS. 7(a), 7(b), and 7(c) are dependency graphs of the handshake controller for initializable implementation;

FIG. 8 are Karnaugh maps of an A/D converter;

FIG. 11 are Karnaugh maps for the SIS asynchronous circuit benchmark suite qr42.g;

DETAILED DESCRIPTION OF THE INVENTION

The classical approaches to asynchronous circuit modeling and synthesis are based on either the Huffman or Muller model. The asynchronous design is specified as a flow table or state transition diagram. However, both methods are limited to small circuits because the size of flow table or state transition diagram representation are exponential in the number of specified signals. Also, the Huffman model relies on delay bounds and the fundamental mode assumption to guarantee correct operation. Both models are unable to model concurrency.

The present synthesis procedure comprises the following key steps. The input to the synthesis system is an asynchronous design that is specified in terms of an STG. In an STG, concurrency is modeled explicitly. The nodes in the STG represent signal transitions. The STG edges denote causal relationships between the transitions. The signals are either primary inputs, internal signals or primary outputs. Signals other than primary inputs are called non-input signals. An asynchronous state graph (ASG) that describes the state of all signals (primary and non-input) is derived directly from the STG by executing a set of firing rules. The state assignment is also implicitly specified by these firing rules and is therefore fixed for a particular STG. Each state is encoded with a binary vector of n-bits, where n is the total number of primary input and non-input signals. The $i^{th}$ bit in a state vector represents the value assumed by the $i^{th}$ signal. Every non-input signal is implemented separately assuming that all other signals are independently controllable. The on-set, off-set and don't care-set of the next-state function of a non-input signal are readily available from the asynchronous state graph. A gate-level implementation of the non-input signal is easily obtained from these sets by using known combinational logic synthesis techniques.

Figure 1:
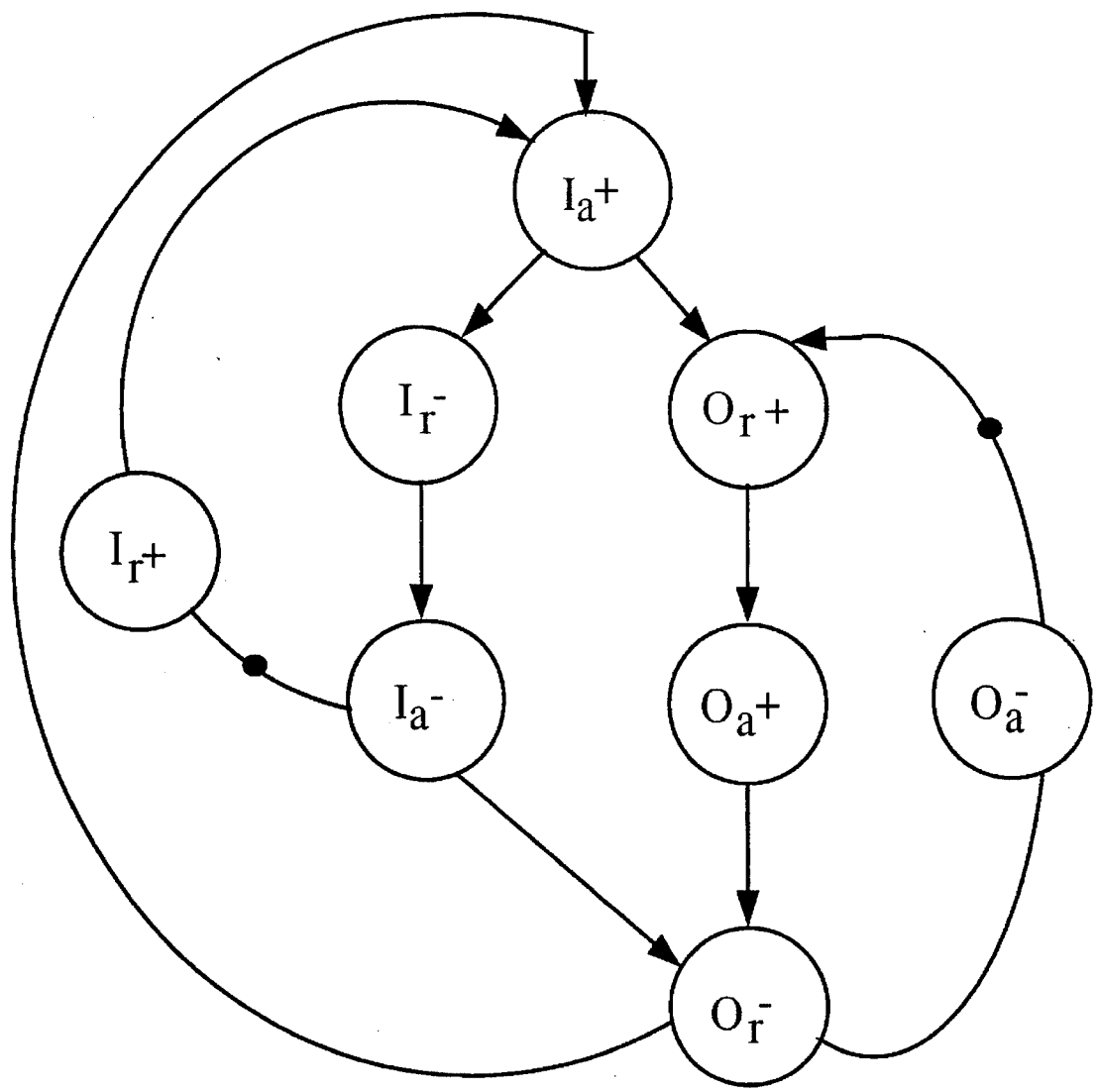
FIG. 1 is a signal transition graph of a trigger module.
Figure 2:
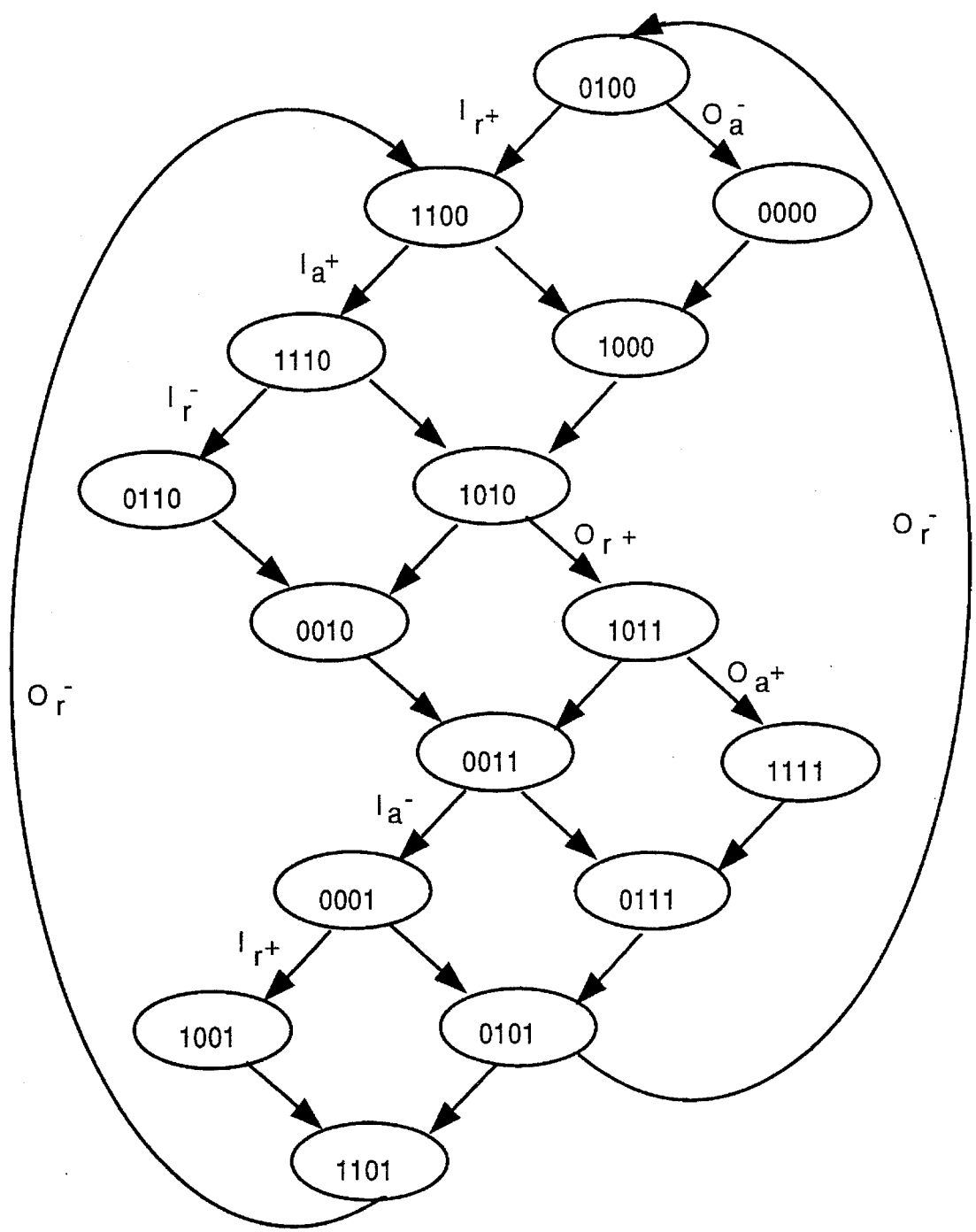
FIG. 2 is an asynchronous state graph for the trigger module of FIG. 1.
Figures 3, 4:
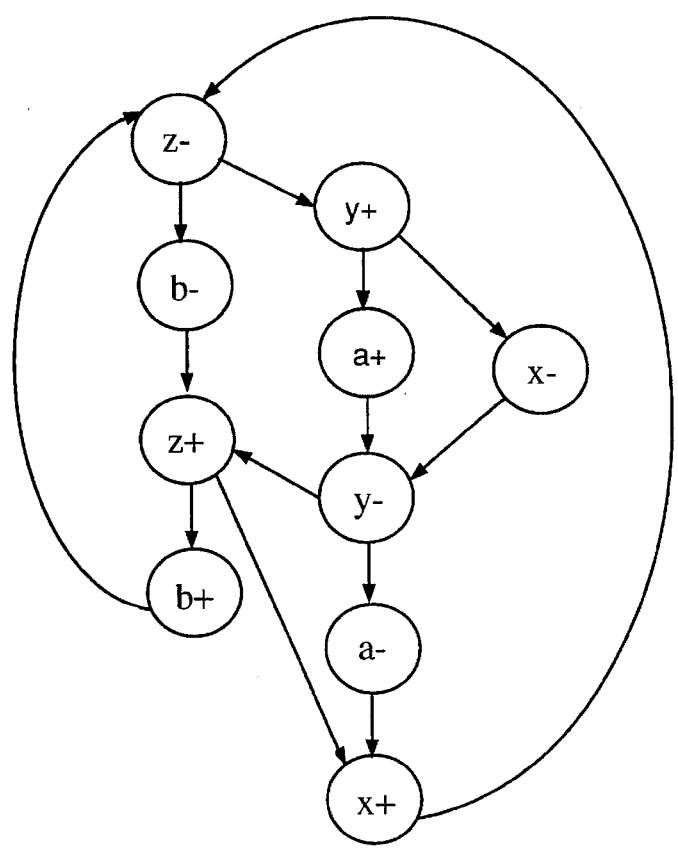
FIG. 3 are Karnaugh maps of the trigger module of FIG. 1.
FIG. 4 is a signal transition graph of a handshake controller.

The synthesis procedure will be described using an example of a trigger module. The STG of the trigger module is shown in FIG. 1. The primary input signals are $I_r$ and $O_a$. The non-input signals are $I_a$ and $O_r$. The symbol $a^+$ represents a rising transition, whereas the symbol $a^-$ denotes a falling transition. The asynchronous state graph shown in FIG. 2 is obtained directly from the STG as follows. In the initial marking of the STG (shown by the tokens on the appropriate arcs), transitions $I_r^+$ and $O_a^-$ are enabled. A marking of the STG corresponds to a state in the state graph. In this case, the initial state is $I_r=O_a=I_a=O_r=0$. The complete state graph may be derived starting from this initial state by executing the signal transitions in the required order. Each state is then encoded with a four bit vector, where the ordering is $(I_r, O_a, I_a, O_r)$. The resulting K-maps (Karnaugh maps) representing the next-state functions of the non-input signals are shown in FIG. 3.

Most of the existing synthesis procedures do not ensure that the final implementation is initializable. As an example, consider the design of a handshake controller that has two primary inputs, a and b, and three non-input signals, x, y, and z. The signal transition graph of the handshake controller is shown in FIG. 4. The next-state functions implemented by the non-input signals are shown in FIG. 5 as three K-maps where the symbol $\phi_i$ denotes a don't care. Circuit initializability is related to the don't care assignments made during synthesis. A necessary requirement for initializability is that at least one non-input signal should be directly controllable by primary inputs alone. Most existing synthesis methods make the following don't care assignments in order to obtain a minimal-logic implementation:

$\phi_1=\phi_3=0$ $\phi_2=\phi_4=\phi_5=\phi_6=1$

The resulting Boolean equations are:

$x=\bar{a}z+x\bar{y}$ $y=x\bar{z}+y\bar{a}$ $z=b\bar{x}\bar{y}+z\bar{x}+zb$

However, the minimal logic implementation is not initializable. A dependency graph is a directed graph. Its vertices represent signals that must be initialized (i.e., the non-input signals). The graph has a directed edge from vertex $v_1$ to vertex $v_2$ if signal $v_2$ is dependent on signal $v_1$. Signal dependencies are easily determined by inspecting the Boolean equations realizing the signals. The dependency graph for the minimal-logic implementation of the controller is shown in FIG. 6. The dependencies between the signals and primary inputs have been omitted for the sake of clarity. The dependency graph shows that every non-input signal is dependent on all other signals. This is a case of cyclic dependency. Here, no signal can be initialized without initializing at least one of the other non-input signals. The cyclic dependency can be broken if some signal initialization is possible using only the primary inputs. However, no signal in the minimal-logic implementation is initializable by using only primary inputs. Therefore, this implementation is not initializable, and consequently, it cannot be tested.

Cyclic dependencies in the dependency graph can be eliminated by a careful assignment of don't cares. As an example, consider again the design of the handshake controller of FIG. 4. From the K-maps of FIG. 5 it is clear that there is no flexibility in implementing the non-input signals y and z. This is because the corresponding K-maps have no don't cares. However, there is considerable flexibility in implementing signal x. In particular, the following don't care assignments allow signal x to be initialized using only primary inputs:

$$\phi_2 = \phi_4 = 1$$

$$\phi_1 = \phi_3 = \phi_5 = \phi_6 = 0$$

The modified Boolean equation realizing signal x is as follows:

$$x = \bar{a}z + x\bar{y}\bar{a}$$

The Boolean equations for signals y and z remain unchanged. Although signal x is realized by a different Boolean equation, it is still dependent on signals y, z and itself. Therefore, the dependency graph for the controller is identical to the graph of FIG. 6. However, the primary input assignment a=1 now initializes signal x to 0 irrespective of the power-up state of the implementation. The dependency graph of FIG. 6 is updated to reflect the initialization of signal x. The updated graph is shown in FIG. 7(a). Once a signal is initialized, its input dependencies can be removed. Therefore, an initialized signal is represented by a vertex having zero in-degree. Initialization of x to 0 and the input a=1 forces signal y to be initialized to the value 0. The dependency graph is updated to reflect the initialization of signals x and y resulting in the dependency graph of FIG. 7(b). Signals x and y and the input assignment b=0 force the initialization of signal z to the value 1. The updated dependency graph is shown in FIG. 7(c). The dependency graph of an initialized circuit is a set of isolated nodes. The input vector a=1 and b=0 initializes the circuit. Thus, a careful assignment of don't cares resulted in an initializable implementation at negligible logic cost. The implementation for signal x now requires a 3-input AND gate rather than a 2-input AND gate. Therefore, a careful assignment of don't cares resulted in an initializable implementation at negligible cost.

The following procedure systematically assigns don't cares to ensure initializability. The procedure assigns as few don't cares as possible. The remaining don't cares can be assigned by a logic minimizer to optimize logic. In this procedure a 3-valued, (0, 1, X) simulation model is used. However, it is important to note that the method works independently of the simulation model chosen.

In the asynchronous synthesis procedure, every non-input signal is implemented separately. Also, the implementation of a non-input signal is derived assuming that all other signals are independently controllable. Therefore, a necessary condition for the initializability of the entire circuit is that the implementations for all non-input signals should be separately initializable. Initialization of any non-input signal implementation can be performed by assuming that all other signals are completely controllable. However, this is not a sufficient condition. It is important to note that the existence of these individual initialization sequences does not guarantee that the entire circuit will be initializable. The derivation of initialization vectors is an essential part of the synthesis procedure.

Short initialization sequences are desirable for test generation or fault simulation. Therefore, the synthesis method first attempts to obtain a single-vector initializable implementation. The present method uses dependency graphs to quickly determine whether or not a given circuit implementation is initializable.

Initialization vectors for a non-input signal implementation are of unit length. This is because the present value of the non-input signal is not considered for computing the initialization vector, and effectively, the non-input signal implementation can be treated as a combinational logic block. Given an incompletely specified K-map for a non-input signal, the corresponding initialization vectors can be derived with or without the assignment of don't cares. The initialization vectors are classified into two categories:

1. A definite vector initializes the non-input signal irrespective of any don't care assignment.
2. A potential vector will initialize a non-input signal only if the signal's implementation is derived using a specific don't care assignment.

As an example, consider the K-map of signal x shown in FIG. 5. Assuming that signals y, z and a are completely controllable, the vector (y=1, z=a= 0) initializes signal x to the value 0 irrespective of any don't care assignment. Therefore, it is a definite initialization vector. However, the vector (y=z=0, a=1) initializes signal x only if the implementation is derived assuming that the don't care $\phi_5$=0. The other definite and potential initialization vectors for signal x are listed in Table 1. Note that for some K-maps, there may be no definite or potential initialization vectors. If this occurs, then it is impossible to realize an initializable implementation.

TABLE 1

| Initialization Vectors for non-input signal x | | |
| --- | --- | --- |
| Vector Type | Input Vector(y,z,a) | Initial Value |
| Definite | 100 | 0 |
|  | 101 |  |
|  | 010 | 1 |
| Potential | 001($\phi_5$ = 0) | 0 |
|  | 011($\phi_6$ = 0) |  |
|  | 110($\phi_2 = \phi_4$ = 0) |  |
|  | 111($\phi_1 = \phi_3$ = 0) |  |
|  | 110($\phi_2 = \phi_4$ = 1) | 1 |
|  | 111($\phi_1 = \phi_3$ = 1) |  |

After deriving initialization vectors for each non-input signal implementation separately, the remaining problem of finding a initialization sequence for the entire implementation becomes one of conflict resolution.

The process for assigning don't cares and enumerating all possible unit length initialization sequences will now be described. A function is defined called INIT that takes as input the following items:

1. Specification of on-set, off-set and don't care set for an uninitialized non-input signal.

2. An assignment for all primary inputs. A primary input can be assigned one of the following three values: 0, 1 or X. Here, the value X implies that the primary input is still unassigned.
3. An assignment for all non-input signals. A non-input signal is either initialized to 0 or 1, or it is as yet uninitialized (U).

The function INIT is only called for an uninitialized non-input signal. The function examines the specification for the non-input signal and determines initialization vectors based on the current partial assignment of signals and don't cares. The derivation of initialization vectors may require the assignment of currently unassigned primary inputs and don't cares. The function either returns a list of initialization vectors or it reports that no initialization vector exists given the current partial primary input, don't care and non-input signal assignment. The function also tags potential initialization vectors with corresponding don't care assignments. If a particular partial assignment of primary inputs and don't cares is unable to initialize the non-input signal under consideration, then the path stemming from this assignment is terminated. In this way, the entire search space is implicitly explored.

Initially, all primary inputs are assigned the value X and all non-input signals are assigned the value U. The function INIT is called for all uninitialized non-input signals. Note that a non-input signal may be initializable to both 0 or 1. Also, several combinations of primary input and don't care assignments may force the non-input signal to assume a particular initial value. These possibilities can be systematically considered by constructing a decision tree which we call an initialization sequence tree (IST). Every call to the function INIT can be viewed as a node in the decision tree. At the top level, the IST has as many nodes as there are non-input signals. A node has as many branches or outgoing edges as there are initialization vectors returned by the corresponding function call. If there are no initialization vectors, then the node has no branches. Such leaf nodes are marked as failure nodes and the search along these paths is terminated.

A branch corresponds to a particular primary input and don't care assignment combination that initializes the non-input signal. Every branch is also labeled with the corresponding primary input and don't care assignment made at that particular level. At a branch, the function INIT is again called for every uninitialized non-input signal. Therefore, at the next level, the branch points to as many nodes as there are currently uninitialized non-input signals. Also, the number of uninitialized signals at the next level has decreased by at least one. The process continues until either all non-input signals are initialized or the circuit is found to be uninitializable by a single vector. If a branch leads to a node where all non-input signals are initialized, then this node does not result in further calls to INIT. Such nodes are referred to as success nodes. Every path from the top level node to a success node corresponds to an initialization vector. The branch labels along the path provide the initialization vector.

Figure 9:
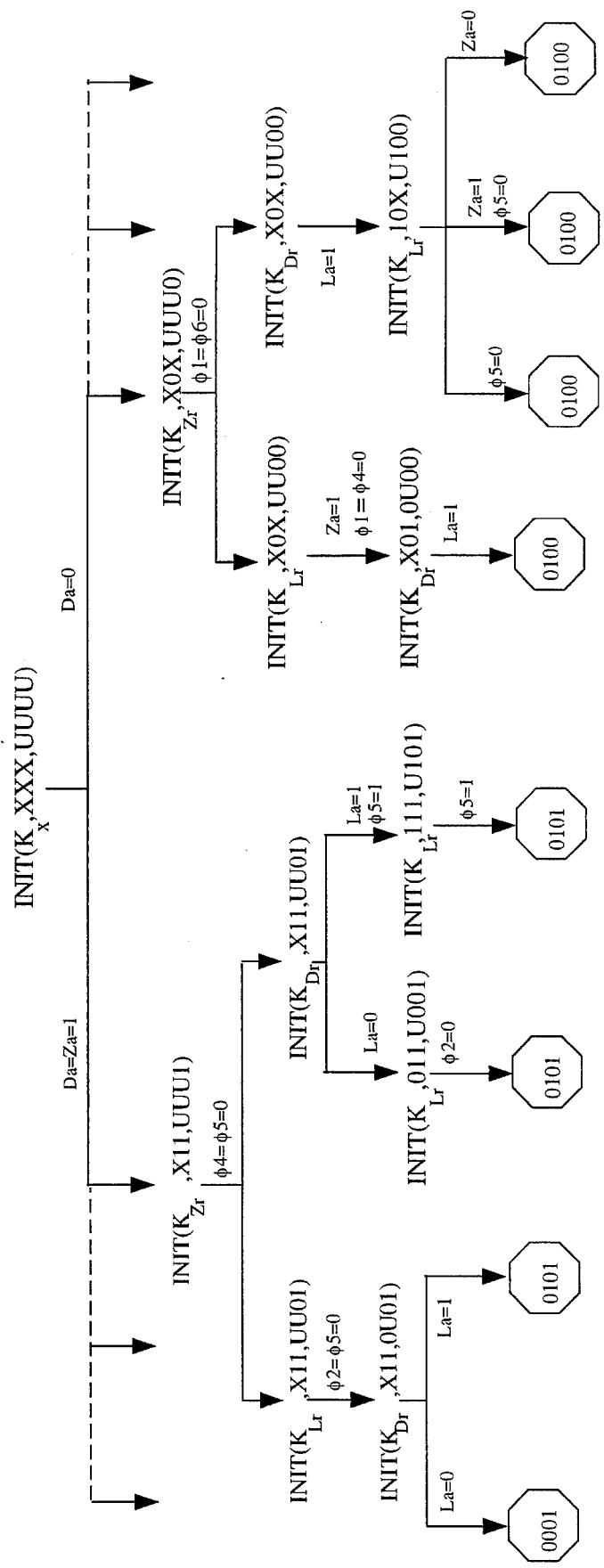
FIG. 9 is a schematic representation for a partial initialization sequence tree.

As an example, the method will be applied to form the initialization sequence tree of the self-timed A/D controller synthesized in an article by T. A. Chu entitled "Synthesis of Self-Timed Control Circuits from Graphs: An Example," in Proc. of the Int. Conf. on Computer Design, pp. 565–561, 1986. The controller has three primary inputs ($L_a$, $D_a$, and $Z_a$) and four non-input signals ($L_r$, $D_r$, $Z_r$, and x). The on-set, off-set, and don't care-set for each signal are taken as input and are represented in terms of K-Maps shown in FIG. 8. The order of primary inputs in an input vector is $L_a$, $D_a$, and $Z_a$. Non-input signals are ordered as $L_r$, $D_r$, $Z_r$ and x in a non-input signal assignment. At the start of the method, no primary inputs are specified. Also, all non-input signals are uninitialized. Hence, the primary input assignment is XXX and the non-input assignment is UUUU. If we follow the method described above, the result is the following levels:

Level 1: INIT is called for each non-input signal. Therefore, the top level has four nodes corresponding to the four non-input signals. In this example, all signals can be independently initialized by using appropriate don't care assignments. However, in the interest of simplicity, only the node corresponding to non-input signal x will be described. The partial initializing tree stemming from this node is shown in FIG. 9. The function INIT returns two initialization vectors. The assignment $D_a=Z_a=1$ initializes x to 1 whereas $D_a=0$ sets x to 0. Therefore, the current node has only two branches. Again, for the sake of simplicity, we will follow only the branch labeled $D_a=0$.

Level 2: The branch labeled $D_a=0$ initializes x to 0. The current primary input assignment is X0X and the non-input signal assignment is UUU0. For this branch, INIT is called for every uninitialized non-input signal. Therefore, this branch leads to three nodes corresponding to non-input signals $L_r$, $D_r$ and $Z_r$. Again, only the node corresponding to $Z_r$ will be described. FIG. 9 also omits the nodes corresponding to $L_r$ and $D_r$ for the sake of clarity. However, a complete initializing tree will include these nodes. The dotted lines shown in the figure indicate the omissions. A call to INIT for $Z_r$ results in only one initialization vector. Signal $Z_r$ can be initialized to 0 by assigning $\phi_1\phi_6=0$.

Level 3: The branch labeled $\phi_{1=\phi 6}=0$ initializes $Z_r$ to 0. The current primary input assignment is X0X and the non-input signal assignment is UU00. This branch leads to two nodes corresponding to $L_r$ and $D_r$ since they are the only remaining uninitialized non-input signals. Now, follow the node corresponding to $D_r$. The INIT call for $D_r$ results in only one initialization vector. Signal $D_r$ can be initialized to 1 by setting $L_a=1$.

Level 4: The branch labeled $L_a=1$ leads to a single node corresponding to the uninitialized non-input signal $L_r$. The current primary input assignment is 10X and the non-input signal assignment is U100. A INIT call for $L_r$ results in three initialization vectors. The corresponding three branches are shown FIG. 9. Every branch leads to a success node, represented by an octagon, since all non-input signals have been initialized. These nodes also show the initialized state of the non-input signals.

The minimal implementation requires that all don't cares in $D_r$'s K-Map be assigned to 1 and all don't cares in the K-Maps for L, and Z, be assigned to 0. A possible set of Boolean equations for this implementation are as follows:

$$D_r=Z_r+L_a+D_r\bar{x}$$

$$L_r=\bar{D}_r\bar{x}\bar{Z}_a$$

$$x=Z_aD_a+xD_a$$

$$Z_r=\bar{L}_rD_a\bar{x}$$

Figure 10:
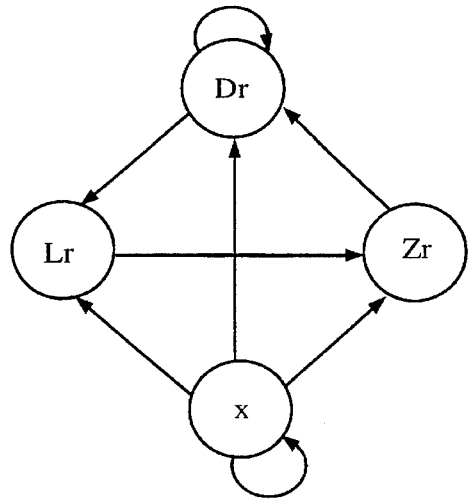
FIG. 10 is a dependency graph for minimal implementation of the A/D converter.

The dependency graph derived from the above equations is shown in FIG. 10. Setting $D_a=0$ sets both x and $Z_r$ to 0. Setting $L_a$ to 1 brings $D_r$ to 1 which then brings $L_r$ to 0. Hence, in this case the minimal-logic implementation is initializable.

If it is not possible to obtain any success node using the single vector initialization described above, then a single vector cannot initialize the circuit. However, the circuit may be initializable by the application of a multiple sequence of input vectors. The single vector initialization method is readily extendable in order to obtain multiple vector initializing sequences.

The single vector initialization method terminates when either all signals are initialized (indicating the existence of at least one success node) or all paths in the initialization sequence tree terminate in failure nodes. All terminal nodes (success or failure) contain the present state of all non-input signals (initialized or uninitialized). Every failure node has at least one uninitialized non-input signal. Failure nodes are used as the starting point in the derivation of multiple input initialization sequences. The single vector initialization procedure is repeated for every failure node. Using the present state of the initialized non-input signals of a failure node, the single vector initialization procedure attempts to derive a new primary input vector that will initialize the uninitialized signals. The application of a new primary input vector may affect the state of all non-input signals. The application of the single vector procedure to every failure node is referred to as a stage of initialization. An initialization stage may terminate in either a success node or new failure nodes. A success node indicates that a multiple vector initialization sequence has been derived. If there are no success nodes, a new initialization stage commences for the failure nodes. The primary input assignments made in each stage yield one vector for the overall initialization sequence. The recursive procedure either generates a multiple vector initialization sequence or proves that no such sequence is possible.

Figure 12A:
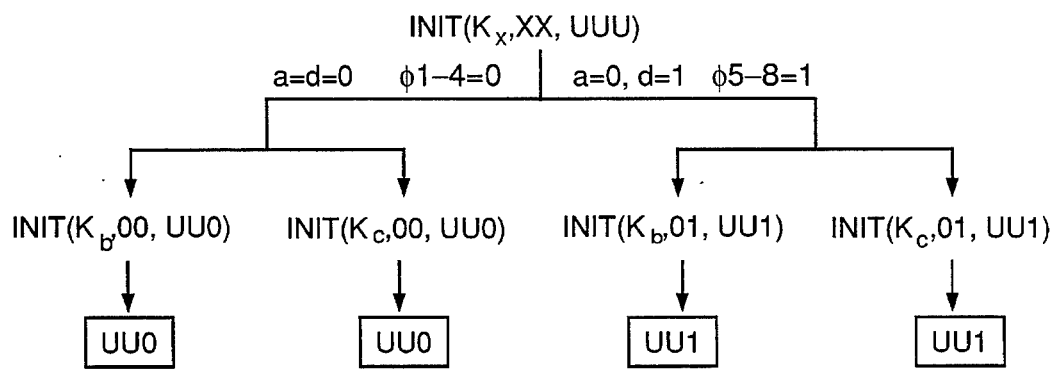
FIG. 12(a) is an initialization sequence tree for the first stage of initialization of the circuit.

The single vector initialization method does not affect the hazard properties of the synthesized circuit. However, the multiple vector initialization procedure may introduce hazards. The hazards can be eliminated by enforcing that consecutive input vectors differ in only one primary input assignment. The method is illustrated for generating multiple vector initialization sequences by considering an example from the SIS asynchronous circuit benchmark suite, qr42.g. The circuit has two primary inputs (a, d) and three non-input signals (b,c,x). The K-Maps for the circuit are shown in FIG. 11. For this example, no unit-length initialization sequence exists. However, the circuit is functionally initializable by a multiple input vector sequence. As mentioned above, each call to the single vector procedure results in a stage of initialization. Hence, the resulting IST may be used to represent the stage. The derivation of the tree is identical to that described above. It is observed that only signal x may be initialized by primary inputs alone. A call to INIT for signal x will result in two initialization vectors. The assignment a=d=0 and $\phi_{1-4}=0$ initializes x to 0 and the assignment a=0, d=1 and $\phi_{5-8}=1$ sets x to 1. Consider only the branch labeled a=d=0. The portion of the tree associated with the branch labeled a=0, d=1, will not produce any success nodes. Once x is initialized, two calls to INIT will be made for b and c. INIT is unable to find initialization vectors for either of these and in both cases returns a failure node containing the state UU0. Hence, the failure node UU0 is obtained in this portion of the first stage of initialization. The IST for the first stage of initialization is shown in FIG. 12(a) where failure nodes are depicted by rectangles.

Figure 12B:
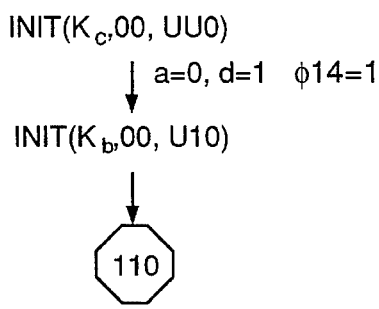
FIG. 12(b) is an initialization sequence tree for the second stage of initialization of the circuit.

The failure node UU0 is selected as the starting point for the second and final stage of initialization. It is still required to initialize signals b and c. The first primary input vector in the initialization sequence is a=d=0. Accordingly, with the single input change requirement, only one of two possible input vectors may be applied. Changing only the value of a to 1 is selected. By repeating the above analysis and using the current non-input signal values as the present state, it is seen that x retains its previous value. Signal c may then be initialized to 1 by setting $\phi_{14}=1$. Finally, b is also initialized to 1. The IST for the second stage of initialization is shown in FIG. 12(b). Hence, the two vectors a=0, d=0 followed by a=1, d=0 are sufficient to bring the circuit to the state b=1, c=1, x=0.

The implicit enumeration procedure described above is able to derive one or all possible initializable implementations along with one or all of the corresponding initialization sequences. For example, if a signal may be initialized by several different combinations of input values and don't care assignments, then all these cases are examined. This is advantageous from a testing point of view in that all faults may not be detectable from the same initial state. INIT may also be used for deriving the initialization sequences of a given implementation.

The don't care assignment procedure described above may be used in the synthesis of synchronous circuits as well. This is possible because the procedure works correctly given a set of K-maps regardless of how they have been synthesized.

In certain cases the design specification itself may be flawed to the extent of resulting in a functionally uninitializable design. Consider the trigger module whose K-maps are shown in FIG. 3. The K-maps are completely specified. Neither of the two non-input signals can be initialized by a primary input vector. Therefore, there must be a flaw in the specification itself. In such a situation the specification is functionally uninitializable. An asynchronous design specification is functionally initializable if there exists at least one corresponding implementation that is initializable. In the handshake controller example, the STG was functionally initializable and the don't care assignment procedure was sufficient to derive an initializable implementation. However, if the specification itself is not functionally initializable, as in the trigger module case, an initializable implementation cannot be found regardless of the don't care assignment. It is necessary, therefore, to elevate initializability considerations to the specification level. Also, stronger conditions must be derived to ensure that initializability is preserved during synthesis.

Both of the above examples show that the K-maps must satisfy a certain property so that an initializable implementation can be obtained from them. Once a design has been specified by an STG, the only control the designer may exercise during the synthesis process is in don't care assignment. Hence, if don't care assignment is not sufficient to modify the K-maps so that they satisfy the necessary properties, the original STG must be transformed into another STG that preserves the original functional behavior and simultaneously ensures that the resulting K-maps will meet the necessary conditions for initializability.

Let the set of all signals be denoted by an ordered set, $S=\{s_1, s_2, \ldots, s_n\}$, where n is the total number of primary input and non-input signals. Each state is assigned a unique n-bit vector, $V(v_1, v_2, \ldots, v_n)$, where $v_i$ is the value assumed by signal $s_i$. Also, $v_i \in \{0,1,X\}$, where X represents an unassigned value.

The set of signals S is divided into two groups. Group $S_D$ contains all assigned primary input signals and initialized non-input signals. Group $S_N$ comprises of all unassigned primary input signals and uninitialized non-input signals. Similarly, the state vectors for a state consists of two parts, $V_D$ and $V_N$ where $v_i \in V_D(V_N)$ if $s_i \in S_D(S_N)$. $V_D$ corresponds to the determined portion of the state vector and $V_N$ represents the undetermined portion.

Let the total set of all states in the ASG be represented by an ordered set, $T=\{t_1, \ldots, t_j\}$, where $j \leq 2^n$. $T_D$ is then the subset of states in T wherein the signals in $S_D$ assume the values specified in $V_D$. If the circuit is in the $k^{th}$ state of $T_D$, then the value of signal $s_i$ in the next state is denoted by $NS_{s_i}(T_{D_k})$. For example, consider the ASG shown in FIG. 2. The set of all signals is denoted by the set $S=\{I_r,O_a,I_a,O_r\}$. If $s_1=I_r$ and $s_2=O_a$ belong to $S_D$, and $V_D$ comprises of $v_1=1$ and $v_2=1$, then $T_D$ consists of states {1100, 1101, 1111, 1110}. If the circuit is in state 1100, then the next state value of signal $O_r$ is given by $NS_{O_r}(1100)=0$.

For a given non-input signal $s_i \epsilon S_N$, all k states in $T_D$ are said to be consistent in $s_i$ if $$NS_{s_i}(T_{D_1})=NS_{s_i}(T_{D_2})=\ldots=NS_{s_i}(T_{D_k}) \quad (1)$$

Furthermore, if all states in $T_D$ are consistent in $s_i$, then $T_D$ is said to satisfy the Consistent Next State (CNS) property for $s_i$.

If $T_D$ satisfies the CNS property for a non-input signal, then the value assumed by that signal in the next state is independent of the present state. Consider again the ASG shown in FIG. 2. States 1100 and 1110 are consistent for signal $O_r$, because $NS_{O_r}(1100)=NS_{O_r}(1110)=0$. However, states 1100 and 1111 are inconsistent for $O_r$, because $NS_{O_r}(1100) \neq NS_{O_r}(1111)$. Also, if $T_D$ consists of states {1100, 1101, 1111, 1110}, then $T_D$ does not satisfy the CNS property for signal $O_r$.

Given an $S_D$ and $V_D$, if all states in the corresponding $T_D$ are consistent for a non-input signal, $s_i$, then $V_D$ is an initialization vector for $s_i$ that sets $s_i$ to $NS_{s_i}(T_D)$.

The following conditions are necessary for a specification to be functionally initializable:

1. There exists at least one definite or potential initialization vector for each non-input signal.
2. There exists an $S_D$, $V_D$ and corresponding $T_D$ such that $S_D$ consists of only primary inputs and $T_D$ satisfies the CNS property for at least one non-input signal. Then, the primary input vector given by $V_D$ initializes the non-input signal.

A specification is functionally uninitializable if either of the above conditions cannot be achieved. In such situations, it is necessary to modify the specification to make it functionally initializable.

Figure 13:
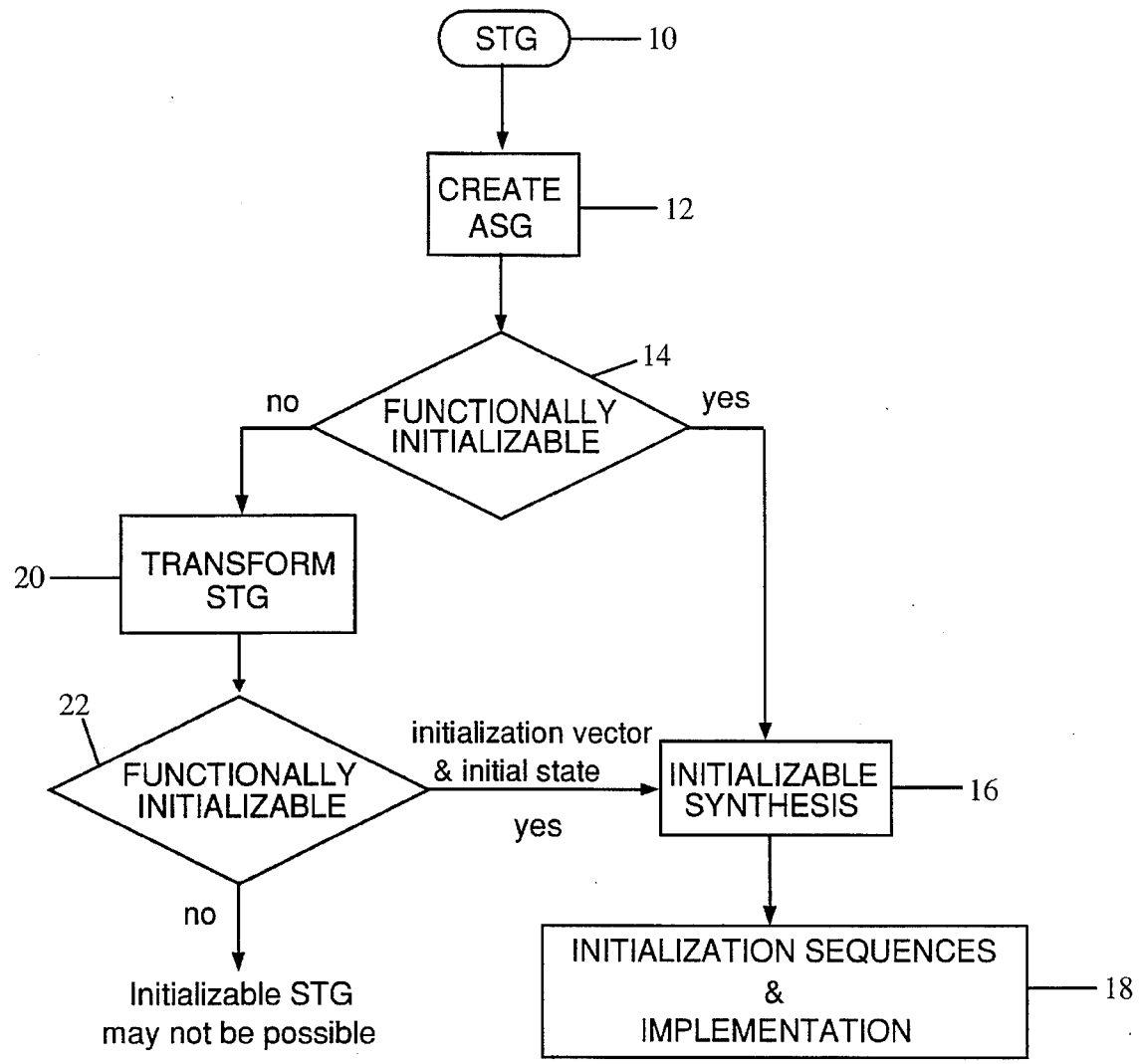
FIG. 13 is a flow chart of a method for the synthesis of initializable asynchronous circuits.

The synthesis procedure is shown in FIG. 13. If the STG is functionally initializable, then the procedure described in an article by S. T. Chakradhar, S. Banerjee, R. K. Roy, and D. K. Pradhan entitled "Synthesis of Initializable Asynchronous Circuits", in IEEE, Proceedings of the Seventh International Conference on VLSI Design, Cat. No. 94TH0612-2, 5–8 January 1994, pages 383–388, will be sufficient to synthesize an initializable implementation and the corresponding initialization sequences. However, since no initializable implementation exists for a functionally uninitializable STG, it is necessary to transform the STG into a functionally initializable one.

The ASG 12 is derived from the original STG 10. It is then determined whether the ASG is functionally initializable 14. If the ASG is determined to be functionally initializable, the circuit is synthesized 16. The circuit design is then implemented (i.e. fabricated) in a known manner and after application of the initialization sequences 18, the design circuit is ready to test. If the ASG is determined not to be functionally initializable, the STG is transformed 20 in accordance with the teachings of the present invention as described hereinafter. It is then determined whether the transformed STG is functionally initializable 22. If the transformed STG is determined to be functionally initializable, the circuit is synthesized 16, implemented and tested 18 in the same manner as if the original STG was functionally initializable. If it is determined that the transformed STG is not functionally initializable, it is concluded that the initialization of the original STG my not be possible. In such event, the present invention cannot be used to create a functionally initializable design from the given specification.

The present invention envisions three procedures that are used together to accomplish this task. The transformed STG is functionally initializable and it has a known initialization sequence and initial state. This information is provided in the initializable synthesis procedure to ensure proper assignment of don't cares. However, if the transformations are not applicable, then a functionally initializable STG may not exist.

Removal of a state from the ASG may alter the strongly-connected property of the ASG. The ASG states are categorized into the following three classes using procedure State-Class:

Class 1: If removal of a state does not disconnect the ASG and the new ASG remains strongly-connected, then the state is included in Class 1.

Class 2: If removal of a state does not disconnect the ASG, but additional states must be also be removed for the new ASG to be strongly-connected, then the state is included in Class 2.

Class 3: If removal of a state disconnects the ASG, then the state is included in Class 3.

Concurrency in the STG causes the states to be placed in Class 1 or Class 2. When a state $t_i$, belonging to Class 1 or Class 2, is removed, there exists an alternate path from $t_i$'s parents to $t_i$'s children. For example, consider the ASG shown in FIG. 2. The states 0000 and 1111 belong to Class 1. The state 0111 belongs to Class 2, because its removal also requires the removal of state 1111 in order for the ASG to remain strongly-connected. In Class 3, the states removed correspond to sequential operations, which do not have a concurrent execution path. For example, in FIG. 2, if both states 1101 and 0101 are removed, then the ASG is disconnected. Hence, the set of states {1101,0101}, belongs to Class 3, whereas individually, both states belong to the Class 2. Members of Class 1 and Class 2 are therefore collectively referred to as non-essential states, whereas members of Class 3 are called essential states and cannot be removed.

A state may be removed from an ASG only if it is non-essential.

The set of inconsistent states, $IS_{s_i}$, for a given $S_D$, $V_D$, and non-input signal $s_i \epsilon S_N$ is identified using the following inconsistent state identification (ISI) procedure which identifies the set of inconsistent states for a specified non-input signal, given the determined part of the state vector.

PROCEDURE ISI($S_D$, $V_D$, $s_i$)
/* Returns a set of inconsistent states */
begin
1. Determine all states in $T_D$;
2. k = |$T_D$|;
3. For n = 1 to k do
4.    If $NS_{s_i}(T_{D_n})$ = 1) then add $T_{D_n}$ to on-list;
5.    else add $T_{D_n}$ to off-list;
6. If on-list or off-list is empty then return; /* $T_D$ satisfies the CNS property for $s_i$ */
7. else return the list with fewer states; /* $T_D$ does not satisfy CNS property*/
end For example, consider the ASG in FIG. 2. Given that $S_D=\{I_r,O_a\}$, $S_N=\{I_a, O_r\}$, and $V_D=\{I_r=1, O_a=1\}$, procedure ISI($S_D$, $V_D$, $O_r$) executes as follows: $T_D=\{1100,1101,1111,1110\}$; on-list={1100,1101,1110}; off-list={1111}; Since neither on-list nor off-list is empty, $T_D$ does not satisfy the CNS property for signal $O_r$. Also, since off-list has fewer number of states than on-list, ISI returns {1111}. If the set of states returned by ISI contains any essential states, those states cannot be removed. If a state that belongs to Class 2 is removed, additional states must be removed in order to preserve the strong-connectivity of the ASG. Note that if the removal of state $t_1$ requires the removal of another state $t_2$ that also belongs to the Class 2, then the removal of $t_2$ will in turn require the removal of a third state $t_3$. If $t_3$ belongs to Class 1, then no more states need to be removed. Hence, the removal of state $t_1$ requires the removal of two additional states, $t_2$ and $t_3$, whereas the removal of $t_2$ just requires the removal of one additional state, $t_3$. Given a list of states to remove (LSR), the following recursive procedure identifies the additional states that need to be removed. This procedure returns the set d states that are removed.

```
PROCEDURE StateRemoval(LSR)
/* Returns the set of states removed and the modified ASG */
begin
    1.  While LSR ≠ {φ} {
    2.      For each tᵢ∈ LSR do {
    3.          Delete its incoming and outgoing edges
                from the ASG.
    4.          LSR = LSR −tᵢ
    5.          LSR = LSR∪ {states with indegree = 0
                or outdegree = 0}
    6.      }
    7.  }
    8.  Return the set of all state removed
end
```

Consider the ASG in FIG. 2. The removal of state 1101 requires the removal of only state 1001. However, the removal of state 0101 requires the removal of states 0111 and 0100. The removal of states 0111 and 0100 in turn require the removal of states 1111 and 0000, respectively. The removal of an ASG state prohibits the occurrence of a certain sequence of signal transitions. A restriction on transition sequences can be enforced by introducing additional causality constraints in the STG. A causality constraint imposes an ordering between two transitions that would have otherwise been concurrent. Hence, a causality constraint introduces sequential behavior thereby reducing concurrency. A causality constraint for two transitions is specified in an STG by a directed edge between them. A procedure for identifying the causality constraints imposed by the removal of a state t is given below. The procedure is recursive. If the removal of a state requires the removal of additional states, then causality constraints must be derived for those additional states as well. Let $P_t$ denote the set of parent states of state t. Similarly, $C_t$ represents the set of t's children. $C_t(n)$ is the the $n^{th}$ child of t.

```
PROCEDURE CausCons(t):
/* Returns a set of causality constraints */
begin
    1.  TSR = StateRemoval(t);
    2.  /* TSR is the total set of states removed */
    3.  For each state j in TSR do {
    4.      Determine Pⱼ and Cⱼ from
            the new ASG;
    5.      Let k = the number of states in Cⱼ
    6.      For n = 1 to k do {
    7.          Find the shortest path from a state in
                Pⱼ to state Cⱼ(n)
    8.          The transition sequence specified by this path
                corresponds to a causality constraint
    9.      }
    10. }
end
```

There must be at least one alternative path from a parent to each child of the removed state. This is necessary to preserve the strong connectivity of the ASG. Hence, one causality constraint is required for each child.

For example, in the ASG shown in FIG. 2, the removal of state 0111 requires the removal of state 1111 as well. We must first derive the causality constraint associated with the removal of state 1111. The parent of state 1111 is 1011. Its child is 0111. There is only one path from 1011 to 0111. The transition sequence along this path is $I_r^-$ followed by $O_a^+$ thereby requiring an edge from $I_r^-$ to $O_a^+$ in the STG shown in FIG. 1. Now to derive the additional causality constraint associated with state 0111, it is seen that the only parent of 0111 that need be considered is 0011. Also, 0101 is the only child of 0111. Hence, the causality constraint specified by the path from 0011 to 0101 requires that an edge be placed from $I_i^-$ to $O_a^+$ in the STG. However, since $I_r^-$ must occur before $I_a^-$, the edge from $I_r^-$ to $O_a^+$ becomes redundant and can be removed. Removal of a state introduces additional causality constraints that may reduce concurrency. Therefore, a cost is assigned to every state that is being considered for removal. Consider the removal of states $t_1$ and $t_2$ from the ASG. If removal of state $t_1$ requires the removal of more states than that required by removing state $t_2$, then we say that $t_1$ has a higher cost. Hence, state $t_2$ is a better candidate for removal.

Figure 14:
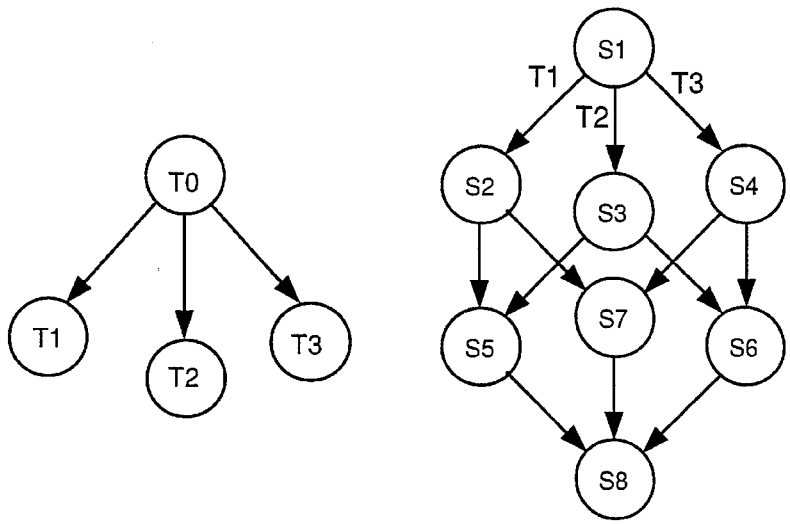
FIGS. 14(a), 14(b) and 14(c) are examples used for cost factor calculation.
Figure 14:
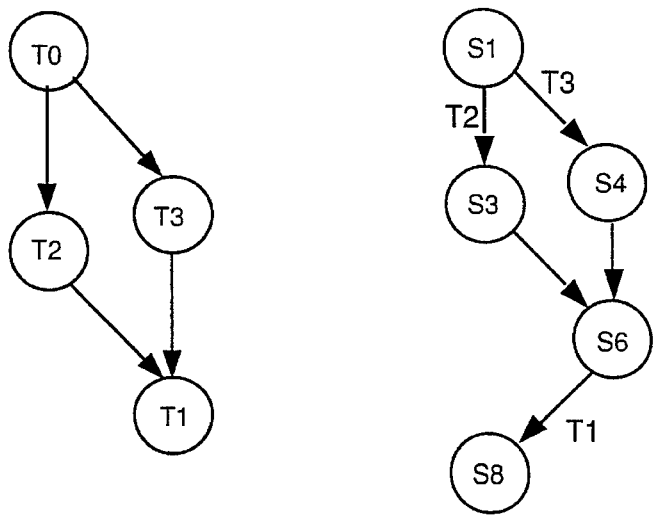
Figure 14:
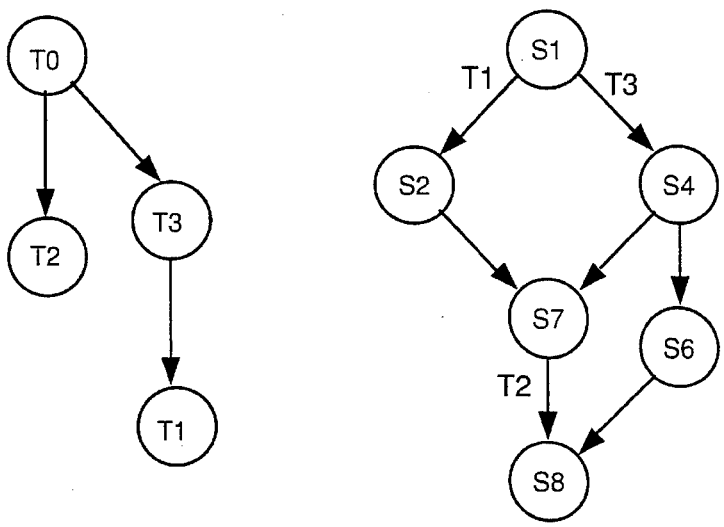

For example, consider the ASG shown in FIG. 2. Removal of state 0101 requires the removal of four additional states whereas the removal of state 1111 requires no additional states to be removed. Hence, state 1111 has a lower cost than state 0101. It may not always be possible to calculate the overall number of states removed by inspection of the ASG. The causality constraints introduced in the STG by the removal of an ASG state may cause a further reduction in the overall number of states in the new ASG. For example, consider the STG fragment shown in FIG. 14(a). The corresponding partial ASG is also shown. Both states S2 and S5 belong to Class 1. Therefore, their removal does not require the removal of any additional states to preserve the strong-connectivity of the ASG. If state S2 is removed, then two causality constraints must be added to the original STG as shown in FIG. 14(b). The ASG constructed from this STG is also shown. This ASG has only five states, whereas the original ASG had eight states. Similarly, if S5 is removed, a single causality constraint is added to the original STG. The modified STG and corresponding ASG is shown in FIG. 14(c). This ASG has six states. Hence, the removal of state S2 causes the net removal of three states, whereas the removal of state S5 causes the net removal of only two states. Therefore, S5 has a lower cost than S2.

The following description is limited to STG's that can be initialized by a single vector. The procedure is also applicable to STG's requiring multiple vector initialization. It is assumed that the removal of a state only adds don't care entries to the K-maps and does not affect the other entries. Therefore, if an entry was a 1(0) prior to state removal, it will either remain a 1(0) or it will become a don't care after state removal. If this condition is not satisfied, the procedure may fail to derive an initializable STG. The overall procedure is iterative. One non-input signal is initialized in each iteration. The basic steps of the procedure are as follows:

```
PROCEDURE STGTransform:
begin
    1.  Initially, S_D consists of all primary inputs and
        S_N contains all non-input signals. Thus, V_D corresponds
        to an unassigned primary input vector. IS_{sᵢ}
        is the set of inconsistent states for the non-input signal sᵢ.
```

-continued

2. While $IS_{S_i} = \{\phi\}$ {
3.   Pick a $V_D$
4. }
5. While $S_N \neq \{\phi\}$ {
6.   For all $s_i \in S_N$ do
7.     $IS_{s_i} = ISI(S_D, V_D, s_i)$;
8.     If $IS_{s_i}$ does not contain any essential states then assign a cost to it.
9.   end
10.  Select $s_i$ having the lowest cost of $IS_{s_i}$;
11.  SR = StateRemoval($IS_{s_i}$);
12.  Derive causality constraints for each $k \in$ SR and add these to the list of causality constraints
13.  $s_i$ is added to $S_D$ and is removed from $S_N$; $v_i = NS_{s_i}(T_D)$ is added to $V_D$.
14. }
15. Modify STG by adding edges corresponding to all causality constraints;
16. Remove redundant edges;
17. Create a new ASG and a new set of K-maps;
18. return $V_D$;
end The initialization vector is given by the primary input signal values in $V_D$. The initial state corresponds to the non-input signal values specified in $V_D$. This information is then provided to the initializable synthesis procedure described in an article by S. T. Chakradhar, et al, supra to ensure that the don't cares are assigned accordingly. In a PhD thesis entitled "Synthesis of Self-Timed VLSI Circuits from Graph-Theoretic Specifications" by T. A. Chu at MIT in 1987, liveness and Unique State Coding (USC) were identified as the syntactic properties that must be satisfied in order to ensure hazard-free operation. The liveness property mandates that the ASG and consequently the STG must be strongly-connected. In the present invention, the state removal procedure preserves liveness because only non-essential states are removed. USC is also preserved by state removal. If the original STG satisfied USC, then the removal of states cannot violate the USC property. Since no new states have been added, the state coding will remain the same as before.

Hence, the proposed STG transformations, which consist of the removal of non-essential, inconsistent states and the introduction of additional causality constraints, preserve the liveness and USC properties.

The procedure will be illustrated with an example of a functionally uninitializable design taken from the literature. Consider the synthesis of a trigger module presented in the PhD thesis entitled "Synthesis of Self-Timed VLSI Circuits from Graph-Theoretic Specifications" by T. A. Chu at MIT in 1987. The module has two primary inputs $(I_r, O_a)$ and two non-input signals $(I_a, O_r)$. The STG, ASG and synthesized K-maps for the non-input signals are shown in FIGS. 1, 2, and 3, respectively. By inspection of the K-maps, it is apparent that the design is functionally uninitializable, because neither of the two non-input signals may be initialized by primary inputs alone. The ordering of signals in the state assignment is $(I_r, O_a, I_a, O_r)$. For the sake of brevity, only the case when signal $O_r$ is considered first for initialization will be described. It is important to note, however, that if this path does not lead to an initializable solution, then use of the other signal first must be tried. The necessary STG transformations are derived as follows.

$$S_D = \{I_r, O_a\}; S_N = \{I_a, O_R\}; V_D = \{I_r = X, O_a = X\}.$$

The results of calls to ISI and StateClass for signal $O_r$ for every $V_D$ are summarized in Table 2. The cost, in terms of the total number of states removed, is also given.

TABLE 2

Inconsistent States and State Classification for $O_r$

| $V_D$ | ISI | StateClass | Cost |
|---|---|---|---|
| $I_r = 0, O_a = 0$ | 0000 | 1 | 1 |
| $I_r = 0, O_a = 1$ | 0111 | 2 | 2 |
| $I_r = 1, O_a = 1$ | 1111 | 1 | 1 |
| $I_r = 1, O_a = 0$ | 1000 | 2 | 2 |

States 0000 and 1111 are associated with the lowest cost. Hence, they are the best candidates for removal and are considered first. Consider the removal of state 1111. Removal of state 0000 can be done similarly.
StateRemove and CausCons are used to determine the causality constraints imposed by the removal of state 1111. The result is that an edge from $I_r^-$ to $O_a^+$ must be added to the original STG.
$O_r$ is added to $S_D$ and is removed from $S_N$; $O_r = 0$ is added to $V_D$.
Signal $I_a$ must be initialized. First check if it can be initialized now that $O_r$ has been initialized. $V_D$ is updated and now contains $\{I_r = 1, O_a = 1, O_r = 0\}$.
$ISI(S_D, V_D, I_a)$ returns the null set because the corresponding $T_D = \{1100, 1101\}$ satisfies the CNS property for $I_a$.
$I_a$ is then added to $S_D$ and is removed from $S_N$; $I_a = 1$ is added to $V_D$.
Since, $S_N = \{\phi\}$, no more signals need to be initialized.
The original STG is modified by adding an edge from $I_r^-$ to $O_a^+$.
A new ASG is created. This is a subgraph of the original ASG with state 1111 absent.
The new K-maps, initialization vector and initial state are then provided to the procedure described in the article by S. T. Chakradhar, et al so that the don't cares are assigned properly.
The Boolean equations are:

$$O_r = I_a O_r \bar{I}_r + O_r \bar{O}_a + I_a \bar{O}_a$$

$$I_a = I_a \bar{O}_r + I_a I_r + \bar{O}_r I_r$$

It can be shown that the primary input vector $I_r = 1, O_a = 1$ initializes the circuit to state $O_r = 0, I_a = 1$.

Figure 15:
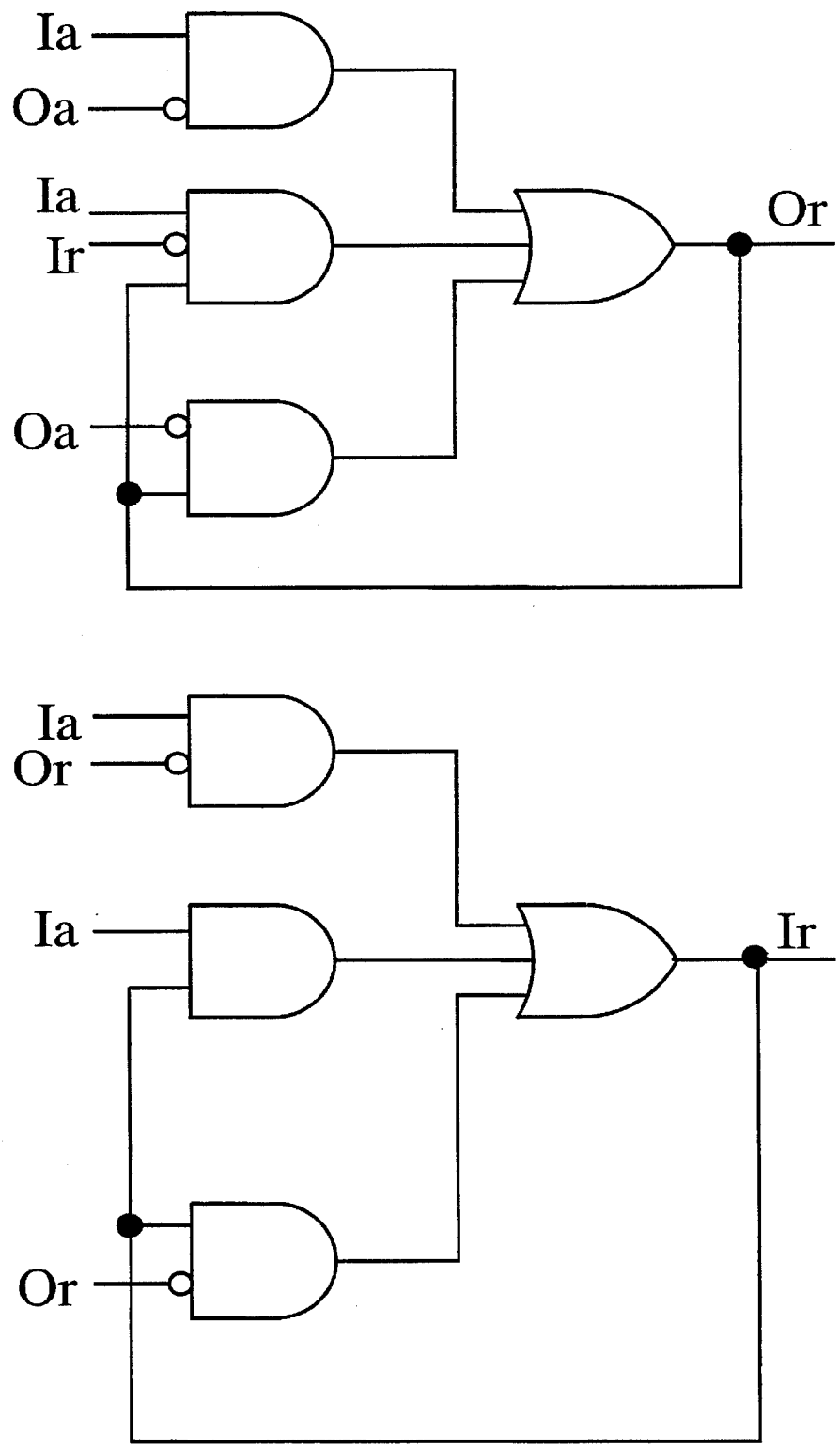
FIG. 15 is a schematic diagram of the trigger module.

FIG. 15 is a schematic representation of an initializable trigger module designed in accordance with the teachings of the present invention. The circuit design shown may be fabricated in a conventional manner. The initialization sequence is applied to the fabricated circuit, and the circuit is then ready to be tested.

While there has been described and illustrated a method of asynchronous circuit synthesis which results in the design of an initializable circuit, it will be apparent to those skilled in the art that modifications and variations are possible without deviating from the broad principle and spirit of the invention which shall be limited solely by the scope of the claims appended hereto.

What is claimed is:

1. A method of synthesizing an initializable asynchronous circuit design from a signal transition graph defining circuit functional behavior comprising the steps of:

(a) deriving an asynchronous state graph from the signal transition graph;

(b) determining whether the asynchronous state graph defines a circuit design which is functionally initializable;

(c) if step (b) determines that the design is functionally initializable performing the steps of:

i. specifying the circuit functional behavior in terms of K-maps for input signals and non-input signals;

ii. forming an initialization sequence tree having as its top level a respective root node corresponding to each non-input signal;

iii. applying an INIT function for each node in sequence to form branches having nodes corresponding to non-input signals;

iv. repeating steps (c)(ii) and (c)(iii) for each branch until reaching a success node or a failure node;

v. forming an initialization sequence corresponding to a branch reaching a success node;

(d) if step (b) determines that the design is other than functionally initializable, performing the steps of:

i. deriving an asynchronous state graph from the signal transition graph where each state is encoded with a state vector having a determined portion and an undetermined portion;

ii. identifying inconsistent states for a specified non-input signal from the determined portion of the state vector;

iii. classifying each state identified in step (d)(ii) using StateClass procedure;

iv. selecting a non-input signal and removing any inconsistent state;

v. modifying the asynchronous state graph such that inconsistent states removed in step (d)(iv) result in a modified asynchronous state graph which behaves equivalent to the unmodified signal transition graph with minimal loss in concurrency;

vi. updating the determined portion of the state vector to correspond to the modified asynchronous state graph;

vii. repeating steps (d)(ii) to (d)(vi) until all non-input signals are initialized, and (e) synthesizing the initializable synchronous circuit corresponding to the initializable signal transition graph or the modified signal transition graph.

2. A method of synthesizing an initializable asynchronous circuit design as set forth in claim 1, further comprising step (f) fabricating a circuit corresponding to the synthesized circuit.

3. A method of synthesizing an initializable asynchronous circuit design as set forth in claim 2, further comprising step (g) applying the initialization sequence to the fabricated circuit.

4. A method of synthesizing an initializable asynchronous circuit design comprising the steps of:

(a) specifying the circuit functional behavior in terms of K-maps for input signals and non-input signals;

(b) forming an initialization sequence tree having at its top level a respective root node corresponding to each non-input signal;

(c) performing a INIT function for each node in sequence to form branches having nodes corresponding to non-input signals;

(d) repeating the steps (b) and (c) for each branch until reaching a success node or a failure node, and (e) forming an initialization sequence signal corresponding to a branch reaching a success node.

5. A method of synthesizing an initializable asynchronous circuit design as set forth in claim 4, further comprising (f) synthesizing the initializable asynchronous circuit corresponding to the success node reached in step (e).

6. A method of synthesizing an intializable asynchronous circuit design as set forth in claim 5, further comprising the step (g) fabricating a circuit corresponding to the synthesized design.

7. A method of synthesizing an intializable asynchronous circuit design as set forth in claim 6, further comprising step (h) applying the initialization sequence to the fabricated circuit.

8. A method of synthesizing an initializable asynchronous circuit design comprising the steps of:

(a) specifying the circuit functional behavior in terms of a signal transition graph;

(b) deriving an asynchronous state graph from the signal transition graph where each state is encoded with a state vector having a determined portion and an undetermined portion;

(c) identifying inconsistent states for a specified non-input signal from the determined portion of the state vector;

(d) classifying each state identified in step (c) using StateClass procedure;

(e) selecting a non-input signal and removing any inconsistent state;

(f) modifying the asynchronous state graph such that inconsistent states removed in step (e) results in a modified asynchronous state graph which behaves equivalent to the unmodified signal transition graph with minimal loss in concurrency;

(g) updating the determined portion of the state vector to correspond to the modified asynchronous state graph;

(h) repeat steps (c) to (g) until all non-input signals are initialized and the state vector contains no undetermined portion; and (i) synthesizing, after all non-input signals are initialized, the initializable asynchronous circuit corresponding to the modified asynchronous state graph where the determined portion is useable for initializing the asynchronous circuit for subsequent testing.

9. A method as set forth in claim 8, where said identifying inconsistent states comprises the steps of:

identifying all states having a predetermined determined portion of its associated state vector;

checking the next-state value of each identified state for a predetermined non-input signal; and identifying those states which fail to provide a desired next-state value responsive to the state vector of the determined portion and a predetermined non-input signal.

10. A method as forth in claim 8, where said classifying each state comprises the steps of:

identifying in a first class each state the removal of which does not disconnect the asynchronous state graph and the asynchronous state graph remains strongly-connected even after removal of the state;

identifying in a second class each state the removal of which does not disconnect the asynchronous state graph and another state must be removed for the asynchronous state graph to remain strong-connected; and identify in a third class each state the removal of which disconnects the asynchronous state graph.

11. A method as set forth in claim 10, where said modifying the asynchronous state graph removes states identified in the first class before removing states identified in the second class.

12. A method as set forth in claim 11, where said modifying the asynchronous state graph removes states indentified in the second class in order of states removing fewest additional states.

13. A method as set forth in claim 12, where said removing of additional states is performed by a State Removal procedure.

14. A method as set forth in claim 10, where said identifying inconsistent states removes identified states in the third class.

15. A method as set forth in claim 8, where said modifying the signal transition graph comprises the steps of:

traversing the state graph in a depth-first manner until an inconsistent state is reached;

deleting from the state graph incoming and outgoing edges of a node corresponding to the inconsistent state;

backtracking along the path of the node's ancestors and deleting nodes until reaching a node at which concurrency occurs; and removing redundant arcs from the state graph.

16. A method as set forth in claim 8, where the determined portion of the state vector includes primary input signals and initialized non-input signals and the undetermined portion includes uninitialized non-input signals.

17. A method as set forth in claim 16, where said updating updates the determined portion of the state vector to include initialized non-input signals.

18. A method as set forth in claim 8, where the signal transition graph is functionally uninitializable.

19. A method as set forth in claim 8, further comprising step (j) fabricating a circuit corresponding to the synthesized circuit.

20. A method as set forth in claim 19, further comprising step (k) applying the determined portion of the state vector to the fabricated circuit.

* * * * *